United States Patent
Wu et al.

(10) Patent No.: US 8,030,111 B2
(45) Date of Patent: Oct. 4, 2011

(54) INTEGRATION MANUFACTURING PROCESS FOR MEMS DEVICE

(75) Inventors: Mingching Wu, Taipei County (TW); Hsueh-An Yang, Taipei (TW); Hung-Yi Lin, Taoyuan County (TW); Weileun Fang, Hsinchu (TW)

(73) Assignee: Walsin Lihwa Corp., Taipei (TW)

( * ) Notice: Subject to any disclaimer, the term of this patent is extended or adjusted under 35 U.S.C. 154(b) by 311 days.

(21) Appl. No.: 12/326,355

(22) Filed: Dec. 2, 2008

(65) Prior Publication Data
US 2009/0075406 A1    Mar. 19, 2009

Related U.S. Application Data

(62) Division of application No. 11/091,062, filed on Mar. 28, 2005, now abandoned.

(30) Foreign Application Priority Data

Jun. 18, 2004 (TW) ................................ 93117781 A

(51) Int. Cl.
*H01L 21/00* (2006.01)

(52) U.S. Cl. ................. 438/50; 438/48; 438/52
(58) Field of Classification Search ............. 438/48–52, 438/64; 257/432
See application file for complete search history.

(56) References Cited

U.S. PATENT DOCUMENTS

| | | | |
|---|---|---|---|
| 5,919,548 A | 7/1999 | Barron et al. | |
| 6,805,454 B2 * | 10/2004 | Staker et al. | 359/876 |
| 2004/0152229 A1 * | 8/2004 | Najafi et al. | 438/52 |
| 2005/0205951 A1 | 9/2005 | Eskridge | |
| 2006/0110854 A1 * | 5/2006 | Horning et al. | 438/121 |
| 2006/0145793 A1 * | 7/2006 | Ning et al. | 335/78 |

* cited by examiner

*Primary Examiner* — Dung A. Le
(74) *Attorney, Agent, or Firm* — Chen Yoshimura LLP

(57) ABSTRACT

A method for manufacturing an MEMS device is provided. The method includes steps of a) providing a first substrate having a concavity located thereon, b) providing a second substrate having a connecting area and an actuating area respectively located thereon, c) forming plural microstructures in the actuating area, d) mounting a conducting element in the connecting area and the actuating area, e) forming an insulating layer on the conducting element and f) connecting the first substrate to the connecting area to form the MEMS device. The concavity contains the plural microstructures.

16 Claims, 3 Drawing Sheets

INTEGRATION MANUFACTURING PROCESS FOR MEMS DEVICE

CROSS REFERENCE TO RELATED APPLICATION

This application is a division of U.S. patent application Ser. No. 11/091,062, filed Mar. 28, 2005, which is incorporated by reference as if fully set forth.

FIELD OF INVENTION

The present invention relates to a manufacturing process for an MEMS device, and more particular to an integration manufacturing process for an MEMS device.

BACKGROUND

Since the performance of an optical element is determined by its specific effects, such as the electro-optic effect, the magneto-optic effect and the acoustic-optic effect, and these effects are always resulted from the specific materials and the specific manufacturing processes, the relevant manufacturing cost in the prior art is unable to be effectively reduced. In addition, even though it's known that the optical manipulation could be effectively improved by some movable mechanical components, such as a mirror, a grating and a shutter, the relevant methods for manufacturing the above movable mechanical components with high precision and reliability, but low cost are still unavailable.

However, since the optical microelectromechanical system (MEMS) integrates the traditional semiconductor manufacturing process with the relevant micromaching manufacturing process, it is possible to manufacture the micro movable mechanical components with high precision and high optical quality thereby. Furthermore, since the manufacturing process of the optical MEMS is a batch process, the relevant cost is relatively low. Moreover, if a built-in micro actuator is located together with the micro movable mechanical component within an optical device, the optical manipulation of the optical device can be directly controlled by the micro movable mechanical component. Accordingly, the optical device would have a better performance.

Although MEMS technology does have the potential for the electronics industry, the relevant products are rare. The above situation does not result from the MEMS technology itself but from the follow-up steps of packaging, testing and systematizing. In the prior packaging process for the integrated circuits, the components needed to be packaged are always the static components. However, the components needed to be packaged in MEMS are always the movable micro mechanical components being able to modulate the optical signals, the electronic signal and so on. As above, the prior packaging process will be not so suitable for MEMS components. Therefore, how to prevent the micro movable mechanical components from being destroyed during the packaging process and simultaneously ensure the actuations of the micro movable mechanical components is the current challenge.

In addition, since no testing specific technique and standard are used for testing the optical MEMS components at present, the Optical MEMS components are usually tested by the testing method for the common electronics and optic-electronics components. However, since the conventional testing processes always include the steps of a shock test and a drop test and the testing processes are always performed under an environment with high temperature and high humidity, the conventional testing processes are not suitable for the micro movable mechanical components and MEMS components. In other words, the specific testing methods and relevant testing standards for the optical MEMS components capable of precisely determining the performance of the optical MEMS components is another topic for research. It should be noted that there are similar situations in the manufacturing processes for other MEMS components, such as the magnetic MEMS components and the acoustic MEMS components.

In view of aforesaid drawbacks of the prior art, an integration manufacturing process for MEMS devices is provided in the present invention. Since the integration manufacturing process includes the steps of packaging the MEMS device and setting a testing component, the relevant products formed by the MEMS devices of the present invention could be widely used in many fields.

SUMMARY

In accordance with an aspect of the present invention, a method for manufacturing an MEMS device is provided. The method includes steps of a) providing a first substrate having a concavity located thereon, b) providing a second substrate having a connecting area and an actuating area respectively located thereon, c) forming plural microstructures in the actuating area, d) mounting a conducting element in the connecting area and the actuating area, e) forming an insulating layer on the conducting element, and f) connecting the first substrate to the connecting area to form the MEMS device. The concavity contains the plural microstructures.

Preferably, the first substrate is one of a glass substrate and a quartz substrate.

Preferably, the concavity, the connecting area and the actuating area are respectively formed by etching.

Preferably, the plural microstructures include a testing microstructure.

Preferably, the method further includes a step of g) determining a property of the MEMS device according to a result obtained by testing a performance of the testing microstructure with a testing system.

Preferably, the testing system is a Doppler measuring device.

Preferably, the testing microstructure is an airtightness testing component.

Preferably, the testing microstructure is one of a mirror and a cantilever.

Preferably, the conducting element is made of one of a metal and a polysilicon layer.

Preferably, the second substrate is a silicon chip.

Preferably, the step f) further includes steps of f1) forming a metal connecting layer on the insulating layer, and f2) heating the metal connecting layer for connecting the first substrate to the connecting area.

Preferably, the metal connecting layer is an aurum/indium layer.

Preferably, the step f2) is performed by one of a micromachining and a laser.

In accordance with another aspect of the present invention, a method for manufacturing an MEMS device is provided. The method includes steps of a) forming a cover, b) forming plural microstructures on a substrate, wherein the plural microstructures include a testing microstructure, c) locating a conducting element on the substrate for controlling the plural microstructures, d) forming an insulating layer on the conducting device, and e) connecting the cover to the substrate for forming the MEMS device, wherein the cover covers the plural microstructures.

Preferably, the cover includes a concavity for containing the plural microstructures.

Preferably, the testing microstructure is formed by a Hybrid Surface and Bulk Micromachining (HSBM).

In accordance with another aspect of the present invention, a method integrating a packaging step and a step of setting a testing element therein for manufacturing a resonance device is provided. The method includes steps of a) manufacturing a cover having a concavity, b) providing a substrate, c) locating plural microstructures on the substrate, wherein the plural microstructures include the testing element, d) locating a conducting element on the substrate for controlling the plural microstructures and e) proceeding the packaging step in a vacuum to form the resonance device. The concavity contains the testing element.

Preferably, the step e) is performed by connecting the cover to the substrate.

Preferably, the resonance device is an MEMS device.

Preferably, the resonance device has a performance judged by a property performed by the testing element in a predetermined environment.

In accordance with another aspect of the present invention, a method for testing an airtightness of a resonance device is provided. The method includes steps of a) locating a testing component on a lower substrate of the resonance device, b) packaging the lower substrate by a cover in a vacuum, and c) testing the resonance device under a predetermined environment and judging the airtightness of the resonance device by a property performed by the testing component in a predetermined environment.

Preferably, the testing component is one of a mirror and a cantilever.

Preferably, the step a) further includes steps of a1) locating a conducting device on the lower substrate, a2) forming an insulating layer on the conducting element and a3) forming a metal connecting layer on the insulating layer.

Preferably, the metal connecting layer is used for connecting the cover to the lower substrate in the step b).

In accordance with another aspect of the present invention, an MEMS device formed by an integration method including a packaging step and a step of setting a testing element provided therein is provided. The MEMS device includes a substrate, an insulating layer, a connecting layer and a cover. The substrate has an actuating element, at least a testing element and a conducting layer. The insulating layer is located on the conducting layer. The connecting layer is located on the insulating layer, and the cover is connected to the substrate via the connecting layer.

Preferably, the conducting element is formed by a wire.

Preferably, the wire has a first end connected to one of the actuating element and the testing element, and a second end extended to outside of the MEMS device.

Preferably, the testing component is one of a mirror and a cantilever.

Preferably, a performance selected from a group consisting of an airtightness, an optical performance, a magnetic performance, a mechanic performance, an acoustic performance, and an electronic performance of the MEMS device is obtained by testing the testing element with a measuring device.

Preferably, the cover includes a concavity for containing the actuating element and the testing element.

The above contents and advantages of the present invention will become more readily apparent to those ordinarily skilled in the art after reviewing the following detailed descriptions and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed. Furthermore, although the preferred embodiments disclosed herein are about the manufacturing process of the optical MEMS devices, it should be noted that it would be easy for one skilled in the art to apply the relevant concepts and disclosures of the present invention into the manufacturing processes for other MEMS devices.

Figure 1A:
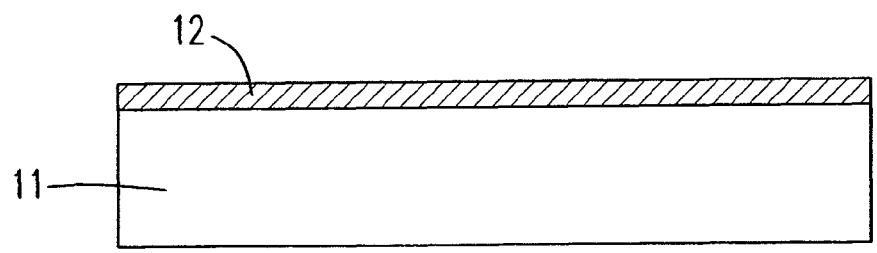
FIGS. 1(A)-(D) are the flow charts showing the manufacturing process of a cover according to a preferred embodiment of the present invention.
Figure 1B:
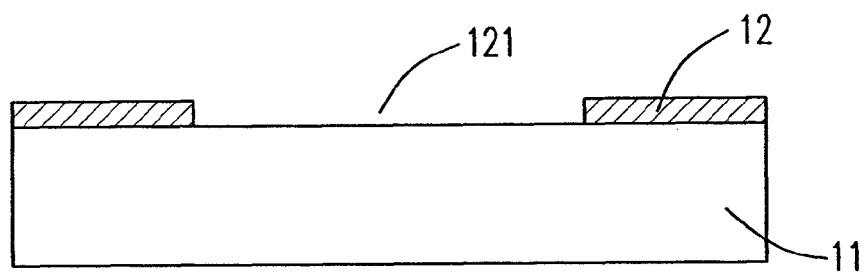
Figure 1C:
Figure 1D:
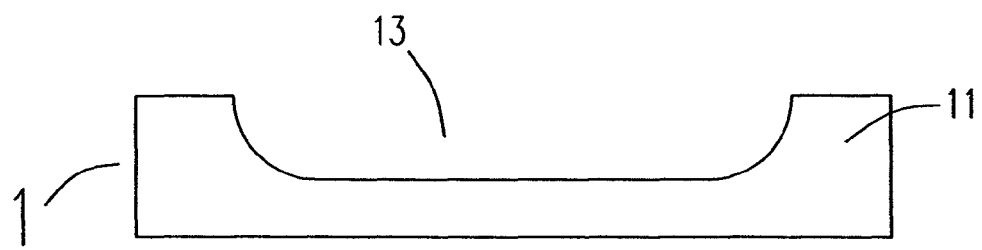

Please refer to FIGS. 1(A)-(D), which are the flow charts showing the manufacturing process of a cover according to a preferred embodiment of the present invention. As shown in FIG. 1(A), during the manufacturing process of the cover 1, a substrate 11 is provided and then a polysilicon layer 12 is located thereon by the low pressure chemical vapor deposition (LPCVD). The substrate 11 is a substrate with relatively high transmittance, such as the transparent glass substrate and the quartz substrate. Next, as shown in FIG. 1(B), an open area 121 is defined and formed by the lithography and the reactive ion etching (RIE). Then, as shown in FIG. 1(C), the concavity 13 is formed by an anisotropic etching, wherein the etching solution includes the hydrofluoric acid, the phosphoric acid and the ammonium fluoride. After that, as shown in FIG. 1(D), the remaining polysilicon layer 12 is removed and the cover 1 with the concavity 13 is formed accordingly. In addition, for increasing the optical quality of the optical MEMS device, it is practicable to plate an anti-reflection coating on the surface of the substrate 11.

Figure 2A:
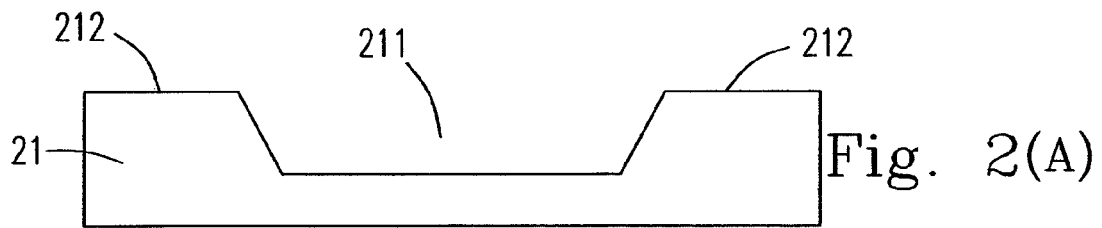
FIGS. 2(A)-(E) are the flow charts showing the manufacturing process of a lower substrate according to a preferred embodiment of the present invention.
Figure 2B:
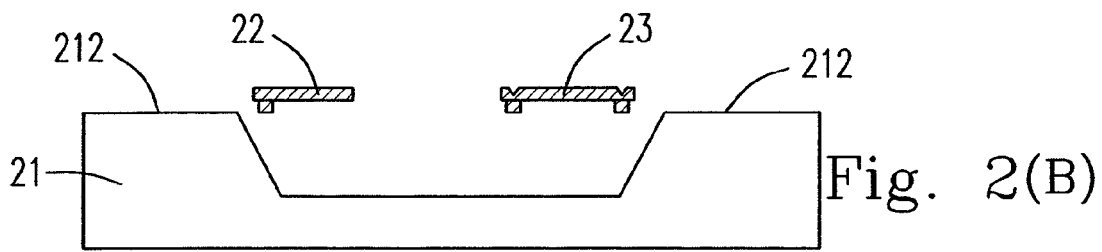

Please refer to FIG. 2(A)-(E), which are the flow charts showing the manufacturing process of a lower substrate according to a preferred embodiment of the present invention. As shown in FIG. 2(A), during the manufacturing process of the lower substrate 2, a substrate 21 is provided and then the actuating area 211 and the connecting area 212 are formed by etching. In general, the substrate 21 is one selected from the glass substrate, the quartz substrate and the silicon chip. It is possible that the connecting area 212 surrounds the actuating area 211. Next, as shown in FIG. 2(B), the micro structure 22 and the testing microstructure 23, such as the micro mirror and the cantilever, are set in the actuating area 211 by the common MEMS bulk micromachining or the common MEMS surface micromachining. In fact, more micro structures could be set in the actuating area 211 if the relevant space is enough. However, in order to simplify the descriptions, only a micro structure 22 and a testing microstructure 23 are shown in this embodiment. Furthermore, it should be noted that the micro structure 22 and the micro testing microstructure 23 could be the suspensory structures or the structures supported by different supporting structures. Actually, in this embodiment, the micro structure 22 and the micro testing microstructure 23 have the supporting structures (not shown). However, in order to simplify the drawing, the relevant supporting structures are not shown therein. Since the property to be tested in this embodiment is the relevant airtightness, the testing microstructure 23 is a micro mirror manufactured by Hybrid Surface and Bulk Micromachining (HSBM).

Figure 2C:
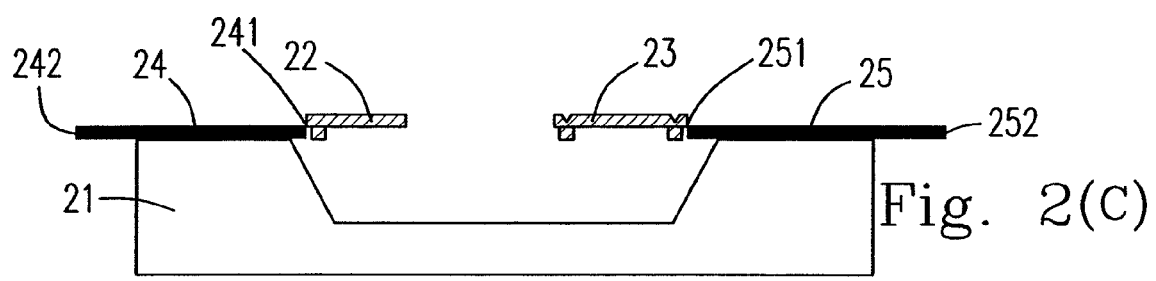
Figure 2D:
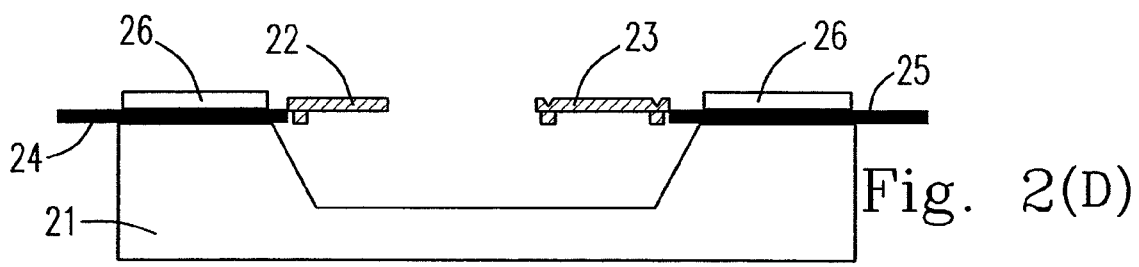
Figure 2E:
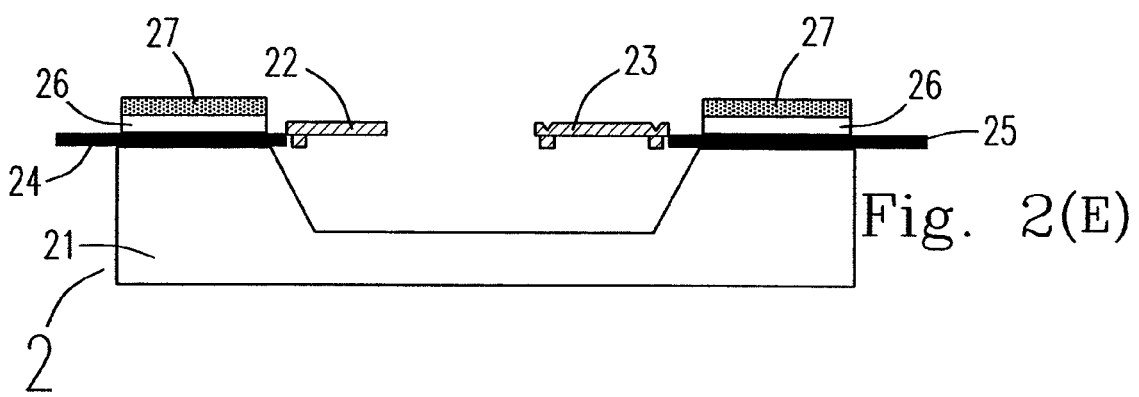

Later, as shown in FIG. 2(C), the wires 24 and 25 are located for respectively controlling the micro structure 22 and the testing microstructure 23. In general, the wires 24 and 25 are the metal wires or the polysilicon wires. The wire 24 has a first end 241 connected to the micro structure 22 and a second end 242 extended to outside of the substrate 21 so as to be connected to a processor (not shown). The wire 25 has a first end 251 connected to the testing microstructure 23 and a second end 252 extended to outside of the substrate 21 so as to be connected to a processor (not shown). Then, as shown in FIG. 2(D), the insulating layer 26 (such as a silicon dioxide layer) is formed on the wires 24 and 25. After that, as shown in FIG. 2(E), the aurum/indium (Au/In) layer 27 is formed on the insulating layer 26 by evaporation or sputtering. Accordingly, the lower substrate 2 is obtained.

It should be noted that the Au/In layer 27 is applied to be a connecting layer, and a polysilicon wire could be set on the Au/In layer 27 for providing a current passing through so as to melt the Au/In layer 27 in the follow-up step of connecting the cover 1 to the lower substrate 2. In addition, in order to facilitate the connection of the cover 1 and the lower substrate 2, the Au/In layer 27 could be melted by a laser and the polysilicon wire is not necessary at that time.

Figure 3:
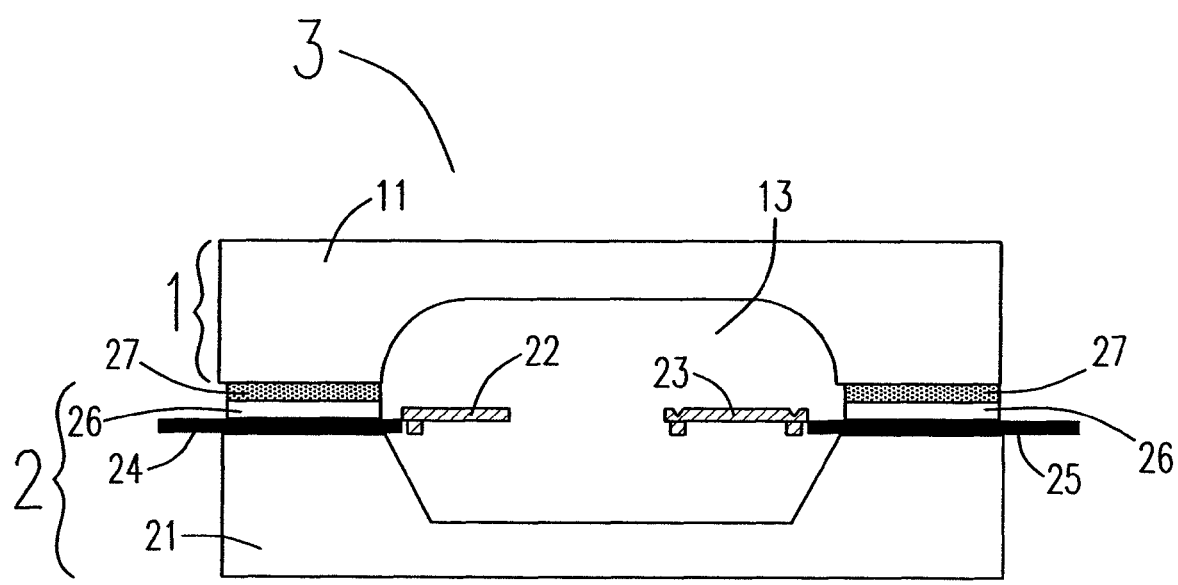
FIG. 3 is a schematic view showing the MEMS device according to a preferred embodiment of the present invention.

Please refer to FIG. 3, which shows an optical MEMS component according to the preferred embodiment of the present invention. The optical MEMS device 3 is formed by the lower substrate 2 and the cover 1. The lower substrate 2 includes the substrate 21, the micro structure 22, the testing microstructure 23, the wires 24 and 25, the insulating layer 26 and the Au/In layer 27. The cover 1 includes the substrate 11 and the concavity 13. The concavity 13 provides the actuating space for the micro structure 22 and the testing microstructure 23. Moreover, it should be noted that since the micro structure 22, the testing microstructure 23, the wires 24 and 25 are locally distributed, there must be some openings between the lower substrate 2 and the cover 1 after they are connected to each other, and the relevant packaging process could not be well performed, and the relevant airtightness could not be so well. Please note that since FIGS. 2(A)-(E) just show a cross-sectional view of the lower substrate during the manufacturing process, one might misunderstand that the wires 24 and 25 are completely and entirely located and distributed on the whole connecting area 212. In fact, the wires 24 and 25 are only extended across some parts of the connecting area 212.

However, one of the features of the present invention is to provide the Au/In layer 27 as a connecting layer and to heat the Au/In layer 27 by a laser. Since the Au/In layer 27 would be melted after being heated and a reflow would be formed therefrom, it is possible that the melted metal (Au/In) would be equally distributed over the whole connecting area 212, and the problems of the unideal packaging process and the relevant airtightness would be overcome. Furthermore, the insulating layer 26 is applied to avoid a short circuit occurring between the Au/In layer 27 and the wires 24 and 25.

After that, the optical MEMS device 3 is tested by a Doppler measuring device (not shown) for testing the relevant performance. It is easy and simple to drive and control the testing microstructure 23 from the outside of the optical MEMS device 3 since the wires 24 and 25 are extended to the outside thereof. In the above embodiment, since the testing microstructure 23 is a micro mirror and the movement of a micro mirror is a planar motion, the properties of the optical MEMS device 3 such as the resonance frequency, the scanning angle and the quality factors can be tested by emitting a laser from the Doppler measuring device to the optical MEMS device 3 and receiving and analyzing a return from the optical MEMS device 3. In addition, after a long-term observation, it is further possible to evaluate the relevant airtightening result of the packaging process. Moreover, after the above descriptions, it should be clear that the above testing process is able to evaluate the failure mode and the reliability of the relevant movable MEMS device.

Furthermore, since a cover will be made on the MEMS device according to the manufacturing process of the present invention, it would be easy to integrate the manufactured MEMS device with other devices, such as the driving circuits, other optical components, and the light sources etc., and it is unnecessary to worry about the problems that the movable MEMS device is easily destroyed during the follow-up assembling and checking processes.

In addition, since it is possible to systematize the above integration manufacturing process including the packaging step and the step of setting a testing component via the System in Packaging (SiP) concept, the relevant manufacturing process does have the novelty, progressiveness and the utility.

Furthermore, a testing technique for measuring the packaging airtightness is lead out. The relevant concept is to drive the micro mirror (which is the testing microstructure provided into the MEME device for testing the relevant performance of the MEMS device) into its resonance state. Since the amplitude of an element (the micro mirror) being its resonance state is determined by the surrounding air damping and the element is packaged in a small concavity, any air leak could affect the amplitude significantly. Therefore, it is easy to evaluate the packaging airtightness by the Doppler system. As above, the present invention does provide a practicable testing technique for measuring the packaging airtightness of the MEMS device, and a new quality control standard might be lead out accordingly.

In view of the above descriptions, it should be noted that even though the above embodiments take an optical MEMS device as an example, the integration manufacturing process including the packaging step and the step of setting a testing component according to the present invention could be applied into other different fields such as the magnetic MEMS device, the mechanic MEMS device, the acoustic MEMS device and the electronic MEMS device etc. by using the suitable component as the testing component.

While the invention has been described in terms of what is presently considered to be the most practical and preferred embodiment, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A method for manufacturing an MEMS device, comprising steps of:
   a) providing a first substrate having a concavity located thereon;
   b) providing a second substrate having a connecting area and an actuating area respectively located thereon;

c) forming plural microstructures in said actuating area;
d) mounting a conducting element in said connecting area and said actuating area;
e) forming an insulating layer on said conducting element; and
f) connecting said first substrate to said connecting area to form said MEMS device,
wherein said concavity contains said plural microstructures.

2. The method as claimed in claim 1, wherein said first substrate is one of a glass substrate and a quartz substrate.

3. The method as claimed in claim 1, wherein said concavity, said connecting area, and said actuating area are respectively formed by etching.

4. The method as claimed in claim 1, wherein said plural microstructures comprise a testing microstructure.

5. The method as claimed in claim 4 further comprising a step of:
g) determining a property of said MEMS device according to a result obtained by testing a performance of said testing microstructure with a testing system.

6. The method as claimed in claim 5, wherein said testing system is a Doppler measuring device.

7. The method as claimed in claim 4, wherein said testing microstructure is an airtightness testing component.

8. The method as claimed in claim 4, wherein said testing microstructure is one of a mirror and a cantilever.

9. The method as claimed in claim 1, wherein said conducting element is made of one of a metal and a polysilicon layer.

10. The method as claimed in claim 1, wherein said second substrate is a silicon chip.

11. The method as claimed in claim 1, wherein said step f) further comprises steps of:
f1) forming a metal connecting layer on said insulating layer; and
f2) heating said metal connecting layer for connecting said first substrate to said connecting area.

12. The method as claimed in claim 11, wherein said metal connecting layer is an aurum/indium layer.

13. The method as claimed in claim 11, wherein said step f2) is performed by one of a micromachining and a laser.

14. A method for manufacturing an MEMS device, comprising steps of:
a) forming a cover;
b) forming plural microstructures on a substrate, wherein said plural microstructures comprise a testing microstructure;
c) locating a conducting element on said substrate for controlling said plural microstructures, said conducting element connects to said plural microstructures;
d) forming an insulating layer on said conducting element; and
e) connecting said cover to said substrate for forming said MEMS device, wherein said cover covers said plural microstructures.

15. The method as claimed in claim 14, wherein said cover comprises a concavity for containing said plural microstructures.

16. The method as claimed in claim 14, wherein said testing microstructure is formed by a Hybrid Surface and Bulk Micromachining (HSBM).

* * * * *